United States Patent [19]

Summerhayes

[11] 4,070,572
[45] Jan. 24, 1978

[54] LINEAR SIGNAL ISOLATOR AND CALIBRATION CIRCUIT FOR ELECTRONIC CURRENT TRANSFORMER

[75] Inventor: Harry R. Summerhayes, Schenectady, N.Y.

[73] Assignee: General Electric Co., Schenectady, N.Y.

[21] Appl. No.: 754,583

[22] Filed: Dec. 27, 1976

[51] Int. Cl.² .............................................. H04B 9/00
[52] U.S. Cl. ........................................ 250/199; 324/96
[58] Field of Search ........................... 250/199, 214 R; 307/311; 324/96

[56] References Cited

U.S. PATENT DOCUMENTS

| | | | |
|---|---|---|---|
| 3,506,833 | 4/1970 | Von Willisen | 250/199 |
| 3,968,361 | 7/1976 | Bumgardner | 250/199 |

Primary Examiner—Richard Murray
Attorney, Agent, or Firm—Lawrence D. Cutter; Joseph T. Cohen; Jerome C. Squillaro

[57] ABSTRACT

An optical data transmission system for use with current sensors on ac high voltage transmission lines comprises a light-emitting diode transmitter at line potential and a silicon photodiode receiver at ground potential. Signals are conducted from the transmitter to receiver along a fiber optic light pipe. A silicon photodiode in a feedback configuration produces a linear ac output light from the light-emitting diode in response to line current. A dc reference signal is superimposed on the ac current data signal to provide system gain calibration. The dc signal is utilized, in a feedback loop, to control the gain of an ac signal amplifier in the receiver and to thus stabilize system calibration.

16 Claims, 3 Drawing Figures

LINEAR SIGNAL ISOLATOR AND CALIBRATION CIRCUIT FOR ELECTRONIC CURRENT TRANSFORMER

This invention relates to electronic instrumentation circuits which are useful with high voltage transmission lines. More specifically, this invention relates to circuits for stabilizing the output of optically coupled data circuits which are used to transmit line current information from high voltage ac transmission systems to ground potential.

BACKGROUND OF THE INVENTION

Current flow in high voltage ac transmission systems is, typically, monitored by means of shunts or current transformers. The signals are, typically, derived using components which float at the power line voltage and must be transmitted to metering, control, and protective relaying equipment which operates near ground potential. Such signals have, in the prior art, been transmitted to ground through current transformers which, necessarily, included expensive and complex dielectric elements to provide necessary high voltage insulation.

The criteria for effectively monitoring current flow and providing protection to high voltage transmission lines requires that current flow data be transmitted from line voltage to ground over a channel having a dynamic range of from approximately one part in $10^4$ to approximately one part in $10^5$, and an absolute accuracy of approximately ±0.3 percent. This performance is obtainable with state-of-the-art current transformers. However, the size and cost of such transformers increases drastically with increased transmission line voltage and may be prohibitive for proposed extra high voltage transmission systems.

It has been proposed that a suitable data channel from a high voltage transmission line to ground potential might be provided by a light source/photodetector pair coupled with a dielectric light-transmission system: for example, a fiber optic light pipe. One embodiment of such a system included analog-to-digital converter circuitry operating at line potential to produce a binary representation of line current flow. The binary data was transmitted to ground along one or more optical fiber light pipes, for example by a pulse code modulation system, and was decoded at ground level to provide analog current flow data. Such systems can be constructed to provide high dynamic range, linearity, and accuracy. However, a large number of active electronic components in the transmitter are required to operate at line potential and the probability of failure in such systems is, therefore, high.

In many current monitoring applications, current flow data may be transmitted to ground through a channel comprising an intensity modulated light-emitting diode (LED) coupled to a photodetector. The ac line current signal is applied to a light-emitting diode operating at power line potential. Light output from the diode is transmitted along an optical fiber or similar light-transmission system to a silicon photodiode operating at ground potential which produces a voltage output in proportion to the light received. The light output of light-emitting diodes is, of course, a nonlinear function of applied current. In accordance with the teachings of the prior art, a silicon photodiode operating in a negative feedback loop may be utilized at the transmitter to linearize the light-emitting diode output and the channel response.

The linearity of silicon photodiodes which are utilized in the above-described optical channel remains relatively constant with temperature. However, the sensitivity of such photodiodes, as well as the electrical characteristics of other components in an intensity modulated data channel have been found to vary as a function of ambient temperature. For example, the sensitivity of silicon photodiodes has been found to vary by approximately ±8 percent over a 100° C temperature range. Means must, therefore, be provided to eliminate or cancel drift in the absolute gain of system components before this intensity modulated LED may be effectively utilized to transmit current data in high voltage ac transmission systems.

SUMMARY OF THE INVENTION

Current flow data is transmitted from a high voltage ac transmission line to ground along a channel which comprises an intensity modulated LED transmitter operating at line potential, a dielectric light pipe extending from the high voltage line to ground potential, and a silicon photodiode receiver operating at the ground end of the light pipe. Current flow data is transmitted as an alternating current signal superimposed upon a direct current reference signal which is generated in the transmitter unit. A feedback circuit in the receiver utilizes the dc reference level to set the gain of an ac signal amplifier and to thus compensate for drift in the sensitivity of photodiodes and in the transmissive characteristics of other system components.

It is, therefore, an object of this invention to provide feedback circuits and methods for automatically calibrating optical transmission systems.

Another object of this invention is to provide accurate electronic current measuring systems for high voltage ac transmission lines.

Another object of this invention is to compensate for temperature related drift of silicon photodiodes in optical data transmission systems.

BRIEF DESCRIPTION OF THE DRAWINGS

The novel features believed to be characteristic of the present invention are set forth in the appended claims. the invention itself, together with further objects and advantages thereof, may best be understood by reference to the following detailed description, taken in connection with the appended drawings in which:

DESCRIPTION OF THE PREFERRED EMBODIMENT

Figure 1:
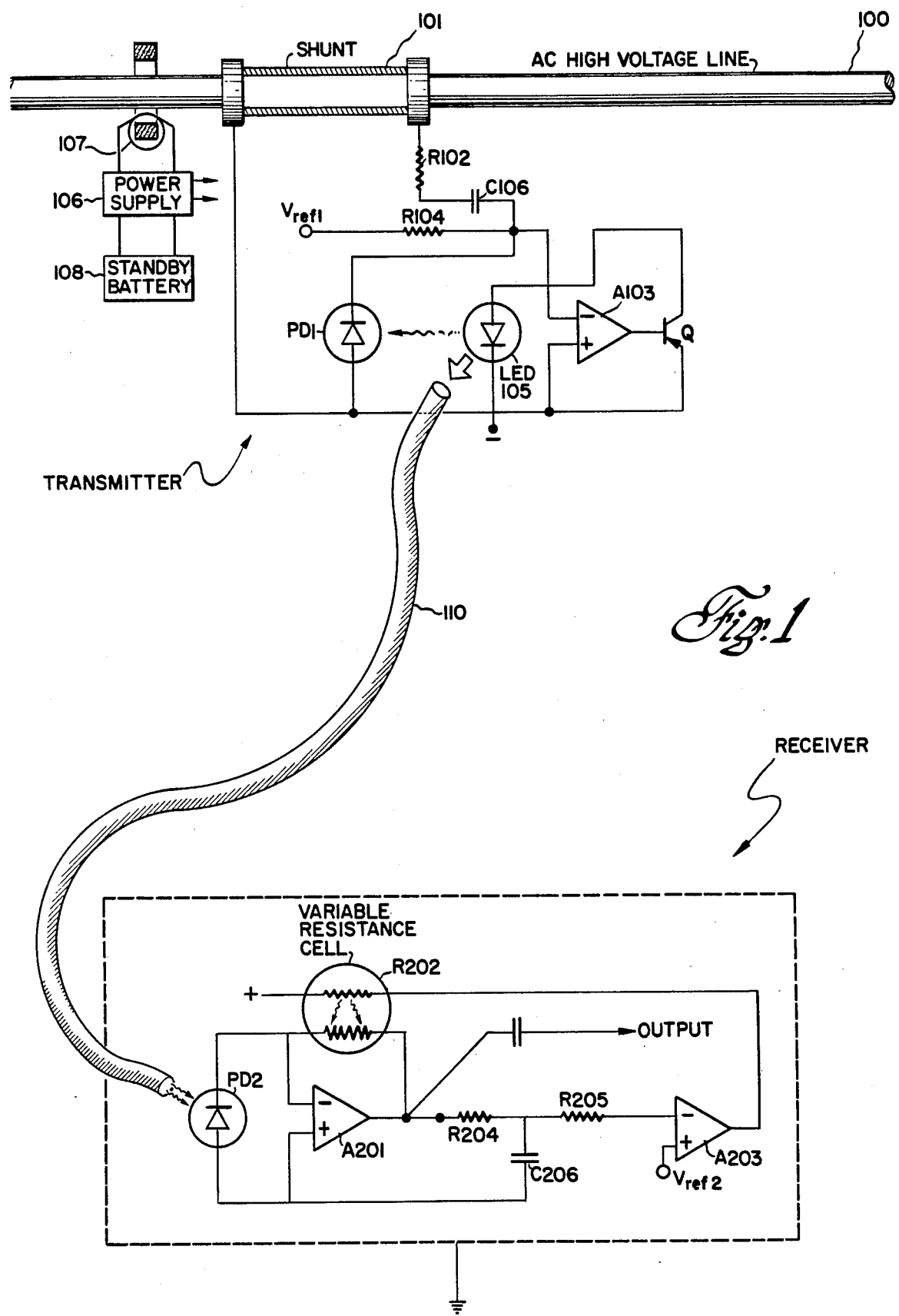
FIG. 1 schematically illustrates an electronic current measuring system of the present invention.

FIG. 1 is a system for transmitting current flow data from a high voltage ac transmission line to ground potential. A current sensor and transmission unit is connected to and maintained at the potential of a high voltage alternating current transmission line 100. An ac signal proportional to the current flow in the line 100 is derived from a current monitoring device, for example, a shunt 101. Alternately, a conventional current transformer with a relative low dielectric rating may be used in place of the shunt 101. An alternating current signal from the shunt 101 is fed through a resistor R 102 and a capacitor C 106 to the inverting input terminal of an operational amplifier A 103. A dc reference signal $V_{ref1}$ is also fed through a resistor R 104 to the inverting input terminal of the operational amplifier A 103. Output current from amplifier A 103 is connected through a current amplifying transistor Q to a light-emitting diode LED 105 which produces an output light signal in response thereto. The output of the LED is, however, not a linear function of current flow. In accordance with the teachings of the prior art, a silicon photodiode PD 1 is disposed to receive a portion of light emitted from the diode LED 105. The silicon photodiode PD 1 is connected to the inverting input terminal of the amplifier A 103 and serves to provide negative feedback which forces the output of the light-emitting diode to vary as a linear function of the input signals.

Power to operate the light-emitting diode and the operational amplifier as well as to supply the reference voltage may be derived from a power supply 106 connected to a transformer 107 or alternately from a shunt on the transmission line 100. Standby storage batteries 108 may be connected to the power supply 106 to furnish operating power for the current monitor at times when the line is shut down. Other methods of furnishing power to the line may also be used.

The sensitivity of silicon photodiode components, for example, the photodiode PD 1 is known to vary as a function of ambient temperature and may, additionally, vary with the age of the diode. The linearity of such devices is, however, known to remain substantially constant over a wide temperature range and the dark current is so small as to be effectively zero. The sensitivity of the photodiode, that is, the proportionality constant relating input light level to output current, may, therefore, be effectively measured by determining the relationship between light input and current output at one finite value of light input. The reference voltage $V_{ref1}$ provides a constant calibrated signal to the light-emitting diode LED 105 and thus permits continuous calibration of the photodiode PD 1 sensitivity.

As described above, a small portion of the light output from the light-emitting diode LED 105 is coupled to the silicon photodetector PD 1 to provide feedback and assure linear operation of the transmitter. The major portion of light emitted from the diode LED 105 is coupled into one end of a dielectric fiber optic light pipe 110 and is transmitted along that pipe to a receiver which operates effectively at ground potential. Light output from pipe 110 is coupled into a second silicon photodiode PD 2 in the receiver circuit. The output signal from the photodiode PD 2 is coupled into the inverting input terminal of an operational amplifier A 201 in the receiver circuit. An electrically variable resistor R 202 which may, for example, comprise an incandescent lamp coupled to a cadmium sulfide photoresistor of the type manufactured by the Clarex Corp. under the tradename PHOTOMOD is connected as a variable negative feedback element around the amplifier A 201. An alternating current output is derived from the amplifier A 201 and is proportional to current flow on the transmission line 100. The output from the amplifier A 201 is also coupled to the inverting input of a second operational amplifier A 203 through a low pass filter R 204, R 205, and C 206. The cutoff frequency of the low pass filter should, preferably, be below the frequency of alternating current on the line 100 to prevent the amplifier A 203 from responding to instantaneous current changes. A dc voltage reference signal $V_{ref2}$, equal to the voltage reference signal $V_{ref1}$, is applied to the non-inverting input of the ampifier A 203. The output of the amplifier A 203 is applied to the lamp filament of the variable resistor R 202 and thus controls the gain of the amplifier A 201 to set its dc output as the level of reference signal $V_{ref2}$. Drift in the characteristics of the silicon photodiodes PD 1 and PD 2, which may be caused by temperature or by other factors, as well as the drift in the gain of the amplifier A 103 is, thereby, compensated.

The accuracy of the calibration system is, of course, dependent on the accuracy with which the reference voltage levels $V_{ref1}$ and $V_{ref2}$ can be maintained. Silicon Zener diodes are, presently, available which provide temperature coefficients as low as 0.1 percent per 100° C and, thus, highly stable regulators for $V_{ref1}$ and $V_{ref2}$ are easily obtainable.

The over-all accuracy and dynamic range of the system are, of course, determined by the signal-to-noise ratio. Variations in coupling which are induced between the various optical components can be a major source of system noise. It is, therefore, necessary to assure rigid coupling between the light-emitting diode, the fiber optic light pipe, and the silicon photodiodes. The transmission properties of the light pipe itself, however, the apparently insensitive to mechanical vibration.

In an experimental system, the light-emitting diode was a General Electric Company Model SSL55C, which was coupled through an external lens into a bifurcated light pipe. A short branch of the light pipe coupled the light-emitting diode LED 105 to the photodiode PD 1, while a twenty foot long branch connected the transmitter to the receiver. The light pipe was a glass fiber-optic type, approximately 0.018 centimeters in diameter, manufactured by the Galileo Company of Sturbridge, Mass., and was covered with a black plastic protective layer. The fiber bundles of the pipe had flint glass cores with borosilicate glass cladding. Measured transmission loss of the pipe was 6.6 dB over a 20-foot length. The silicon photodiodes were type 444B, manufactured by E. G. & G. Inc. of Bedford, Mass. The dynamic range of the experimental system was approximately one part in thirty-four thousand.

Nonlinearities in the ac response of the variable resistance cell R 202 tend to produce distoration of the ac output signal of the receiver and thus may interfere with system operation.

Figure 2:
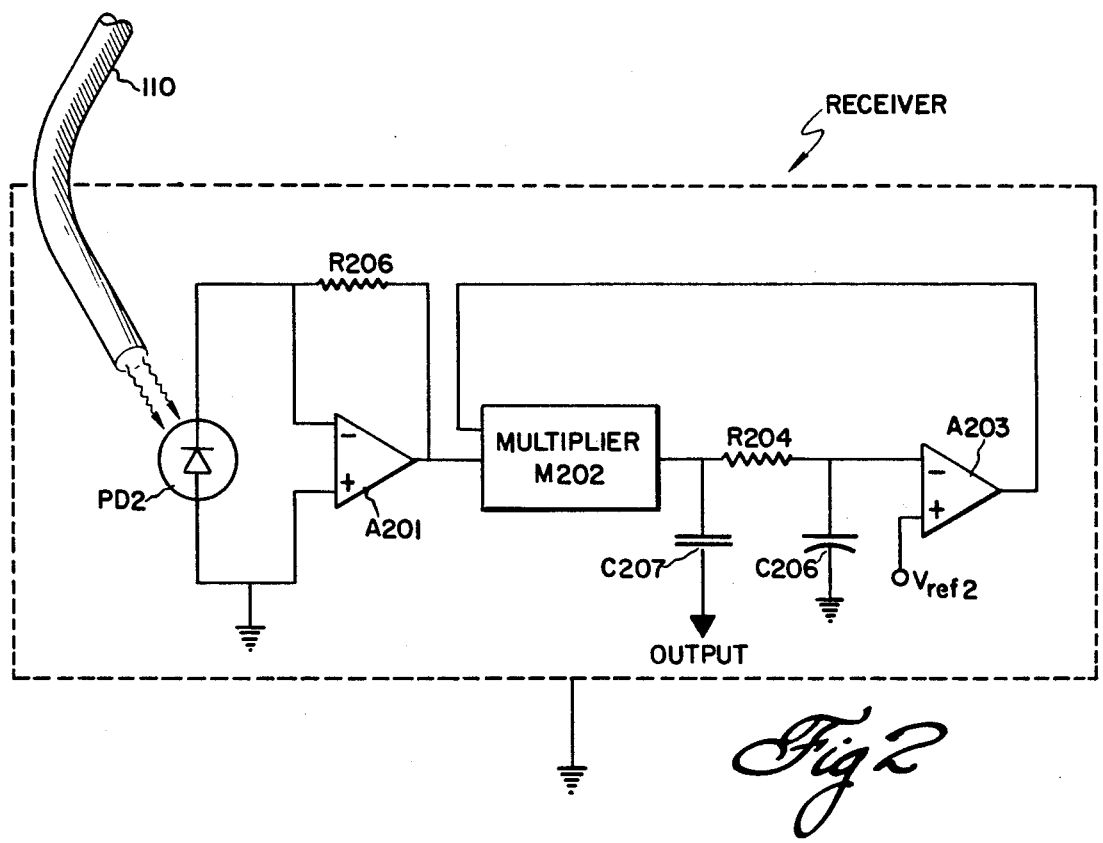
FIG. 2 is an alternate receiver embodiment, including an analog multiplying element, which is useful in the system of FIG. 1.

FIG. 2 is an alternate embodiment of a receiver which tends to eliminate distortion of the ac signal which may be associated with the receiver of FIG. 1. The operation of the circuit of FIG. 2 is substantially identical to the operation of the circuit of FIG. 1, with the exception that the gain of the amplifier A 201 is fixed by a resistor R 206 and a separate analog multiplying element M 202 is inserting between the output of the amplifier A 201 and the input node of a low pass filter R 204 and C 206. The multiplier element M 202 functions to control the gain of the receiver yet produces less signal distortion than does the variable resistance feedback element R 202 in FIG. 1. The ac output signal is derived through a blocking capacitor C 206 connected to the output of the multiplier M 202.

The effective sensitivity of the photodiode in the receiver may, alternately, be adjusted by varying the coupling between the light pipe and the photodiode.

Figure 3:
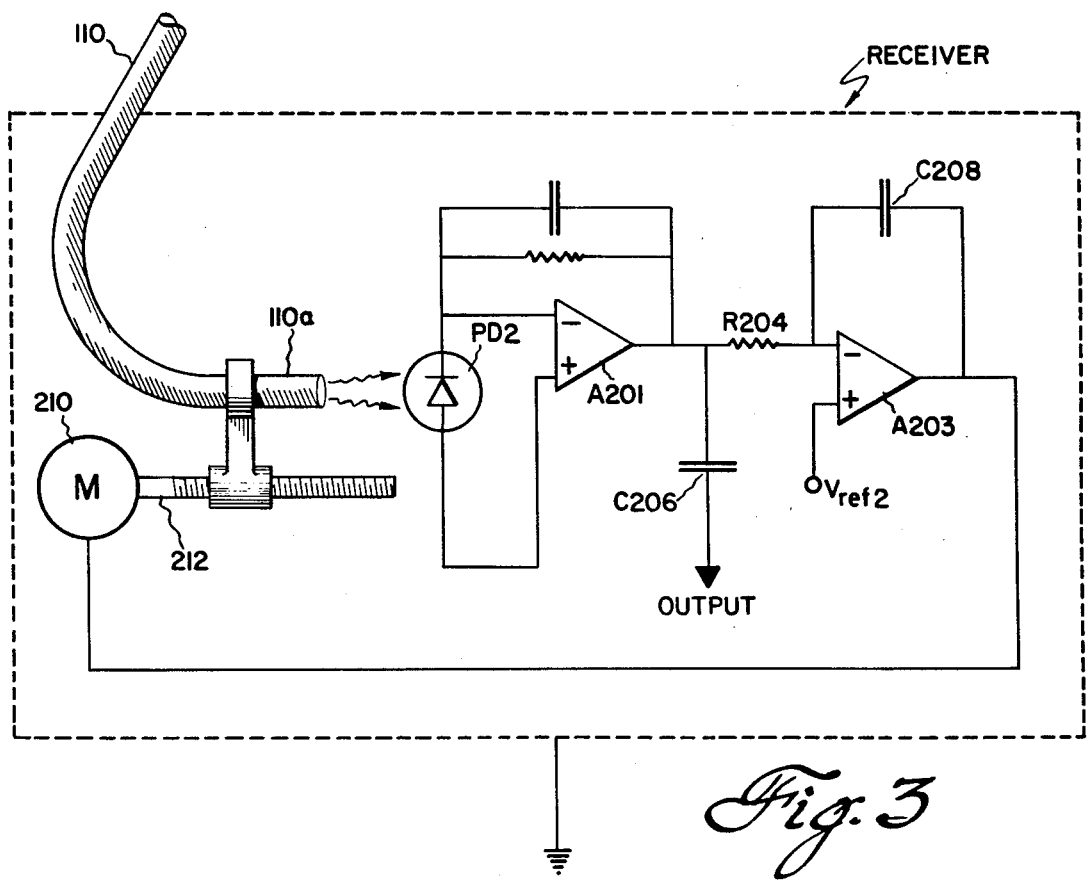
FIG. 3 is an alternate structure for controlling the gain of a receiver in the system of FIG. 1.

FIG. 3 is a receiver embodiment wherein the error signal derived from a comparison of a dc reference signal $V_{ref2}$ with the dc component in the received signal, in amplifier A 203, is fed to a motor 210 which operates a screw drive 212 which acts to vary the spacing between the receiver and end 110a of the light pipe 110 and a photodiode PD 2. The ac signal is derived through a blocking capacitor from the output of a fixed gain operational amplifier A 201 connected to the photodiode. The output of the amplifier A 201 also supplies the dc signal output to an input of the comparison amplifier A 203. The frequency response to the amplifier A 203 is effectively limited to substantially dc frequencies by an input resistor R 204 and a feedback capacitor C 208. Typically, the resistor R 204 may be $1.5 \times 10^6$ ohms and capacitor C 208 may be 1 µf.

Optical transmission systems of the present invention, wherein an automatic gain control functions to stabilize an ac signal response in proportion to a dc reference signal, allow the inexpensive transmission of electronic current transformer data from high voltage transmission lines to ground potential. The systems are insensitive to gain drift, which may be caused by temperature variation or other factors, and provide the dynamic range and accuracy necessary for protection and control of high voltage transmission systems.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An improved optically-coupled data transmission channel comprising:
   means for producing optical electromagnetic radiation which varies in intensity as a substantially linear function of the sum of a variable, alternating frequency input and a first known, direct current reference signal;
   means for receiving said radiation and for producing a first electrical signal in response to the intensity thereof;
   variable gain means connected to process said first electrical signal; and
   first negative feedback means connected to receive the output of said gain means and to stabilize the gain of said channel by furnishing a second signal to vary the gain of said variable gain means in response to the difference between a direct current component to the output of said gain means and a second known, direct current reference signal.

2. The channel of claim 1 wherein the means for producing electromagnetic radiation include:
   a light-emitting diode and
   second negative feedback means for causing electromagnetic radiation emitted from said diode to vary as a linear function of the sum of said alternating frequency input and said first reference signal.

3. The channel of claim 2 wherein said second negative feedback means includes means for tranmitting a portion of the radiation emitted from said diode to first photodetector and means for producing a feedback error signal from the output of said first photodetector.

4. The channel of claim 3 wherein said first photodetector is a silicon photodiode.

5. The channel of claim 4 wherein said means for receiving said radiation and for producing an electrical signal is a second silicon photodiode.

6. The channel of claim 5 wherein said first negative feedback means include a low pass filter.

7. The channel of claim 6 wherein said means for producing electromagnetic radiation is connected and maintained substantially at the potential of a high voltage electrical transmission line and wherein said means for receiving said radiation, said variable gain means, and said first negative means are maintained substantially at ground potential.

8. The channel of claim 1 wherein said means for producing electromagnetic radiation is connected to and maintained substantially at the potential of a high voltage electrical transmission line and wherein said means for receiving radiation, said variable gain means, and said first negative feedback means are maintained substantially at ground potential.

9. The channel of claim 8 further comprising means for determining current flow in said high voltage transmission line and for producing said alternating frequency input in response thereto.

10. The channel of claim 9 wherein said direct current reference signal is stabilized by a silicon Zener diode.

11. The channel of claim 10 further including power supply means connected to, powered from, and maintained substantially at the potential of said high voltage transmission line and connected to supply the power to said means for producing electromagnetic radiation.

12. The channel of claim 1 wherein said variable gain means include:
   an operational amplifier connected to receive and amplify said first signal; and
   an electrically-variable resistance element connected as a negative feedback element around said operational amplifier.

13. The channel of claim 1 wherein said variable gain means include:
   an amplifying stage connected to receive and amplify said first signal and an analog multiplying stage connected to receive the output of said amplifying stage and to multiply said output by the value of said second signal.

14. The channel of claim 1 wherein said variable gain means includes means for varying the optical coupling between said means for producing radiation and said means for receiving said radiation in response to said second signal.

15. The channel of claim 14 wherein said means for varying coupling includes a motor mechanically connected to vary the spacing between optical components in said means for receiving.

16. A method for stabilizing the gain of an intensity modulated ac data channel which includes a transmitter connected to produce an optical radiation output which varies as a substantially linear function of an ac input signal and a receiver which produces an output signal as a substantially linear function of said intensity; comprising the steps of:
   adding a first known dc reference signal to said ac input signal;
   applying said signal to said transmitter and receiving the output thereof with said receiver; and
   varying the gain of said receiver to minimize the difference between a dc component of said output signal and a second dc reference signal, said first reference signal being equal to said second reference signal.

* * * * *